(12) United States Patent
Hafiz et al.

(10) Patent No.: US 8,137,588 B2
(45) Date of Patent: Mar. 20, 2012

(54) NANOSCALE PHOSPHOR PARTICLES WITH HIGH QUANTUM EFFICIENCY AND METHOD FOR SYNTHESIZING THE SAME

(75) Inventors: Jami Hafiz, Minneapolis, MN (US); Toshitaka Nakamura, Oceanside, CA (US); Steven L Girshick, Minneapolis, MN (US); Joachim V. R. Heberlein, North Oaks, MN (US); Amane Mochizuki, San Diego, CA (US); Rajesh Mukherjee, Irvine, CA (US)

(73) Assignees: Nitto Denko Corporation, Osaka (JP); Regents of the University of Minnesota, St. Paul, MN (US)

( * ) Notice: Subject to any disclaimer, the term of this patent is extended or adjusted under 35 U.S.C. 154(b) by 0 days.

(21) Appl. No.: 12/530,620

(22) PCT Filed: Mar. 11, 2008

(86) PCT No.: PCT/US2008/056552
§ 371 (c)(1),
(2), (4) Date: Mar. 19, 2010

(87) PCT Pub. No.: WO2008/112710
PCT Pub. Date: Sep. 18, 2008

(65) Prior Publication Data
US 2010/0200808 A1    Aug. 12, 2010

Related U.S. Application Data

(60) Provisional application No. 60/894,360, filed on Mar. 12, 2007.

(51) Int. Cl.
*C09K 11/02* (2006.01)
(52) U.S. Cl. .................................. 252/301.4 R; 977/844

(58) Field of Classification Search ............... 117/3, 92, 117/103, 108; 427/212, 569; 204/157.43, 204/157.44; 423/263; 264/469, 483; 977/773, 977/844; 252/301.4 R; 426/263
See application file for complete search history.

(56) References Cited

U.S. PATENT DOCUMENTS
5,609,921 A    3/1997   Gitzhofer et al.
(Continued)

FOREIGN PATENT DOCUMENTS
EP    1 473 348    11/2004
(Continued)

OTHER PUBLICATIONS

Asakura et al. "Effects of citric acid additive on photoluminescence properties of YAG:Ce3+ nanoparticles synthesized by glycothermal reaction", Feb. 27, 2007, Journal of Luminescence, vol. 127, pp. 416-422.*

(Continued)

*Primary Examiner* — Jerry Lorengo
*Assistant Examiner* — Lynne Edmondson
(74) *Attorney, Agent, or Firm* — Knobbe, Martens, Olson & Bear LLP

(57) ABSTRACT

Described herein are batches of nanoscale phosphor particles having an average particle size of less than about 200 nm and an average internal quantum efficiency of at least 40%. The batches of nanoscale phosphor particles can be substantially free of impurities. Also described herein are methods of manufacturing the nanoscale phosphor particles by passing phosphor particles through a reactive field to thereby dissociate them into elements and then synthesizing nanoscale phosphor particles by nucleating the elements and quenching the resulting particles.

19 Claims, 5 Drawing Sheets

U.S. PATENT DOCUMENTS

| | | | |
|---|---|---|---|
| 5,885,492 | A | 3/1999 | Lee et al. |
| 6,692,660 | B2 | 2/2004 | Kumar |
| 6,994,837 | B2 | 2/2006 | Boulos et al. |
| 7,101,520 | B2 | 9/2006 | Kumar |
| 2003/0116080 | A1* | 6/2003 | Huang ............................ 117/3 |
| 2005/0271566 | A1 | 12/2005 | Yadav |
| 2006/0051505 | A1* | 3/2006 | Kortshagen et al. .......... 427/212 |
| 2006/0147369 | A1* | 7/2006 | Bi et al. ................... 423/594.17 |
| 2006/0166057 | A1 | 7/2006 | Kodas et al. |
| 2006/0226564 | A1 | 10/2006 | Carpenter |
| 2007/0029291 | A1 | 2/2007 | Boulos et al. |

FOREIGN PATENT DOCUMENTS

| | | |
|---|---|---|
| JP | 61-065226 | 4/1986 |
| JP | 64-022987 | 1/1989 |
| JP | 64-060671 | 3/1989 |
| JP | 01168911 | 7/1989 |

OTHER PUBLICATIONS

LEDs Magazine, 'Nitto Denko develps non-scale YAG phosphor for white LEDs' Nov. 7, 2005 (ledsmagazine.com//news/2/11/10).*

International Search Report and the Written Opinion issued in PCT/US2008/056552.

Boulous, M. I., "The inductively coupled R.F. (radio frequency) plasma," Pure and Applied Chemistry, 57(9): 1321-1352 (1985).

Eckert, H. U., "The induction arc: a state-of-the-art review," High Temperature Science, 6: 99-134 (1974).

Li et al., "RF plasma processing of Er-doped $TiO_2$ luminescent nanoparticles" Thin Sold Films, Elsevier-Sequoia S.A. Lausanne, CH, vol. 506-507, May 26, 2006, pp. 292-296.

Mangolini et al., "Plasma synthesis and liquid-phase surface passivation of brightly luminescent Si nanocrystals" Journal of Luminescence, Amsterdam, NL, vol. 121, No. 2, Dec. 1, 2006, pp. 327-334.

Matsumoto et al., "Synthesis of diamond films in a RF induction thermal plasma," Applied Physics Letters, 51: 737-739 (1987).

Ohkubo et al., "Absolute Fluorescent Quantum Efficiency of NBS Phosphor Standard Samples," J. Illum. Engng. Inst. Jpn. vol. 83, No. 2, pp. 87-93, 1999.

R. Kasuya et al., "Glycothermal synthesis and photoluminescence of YAG:Ce3+ nanophosphors," Journal of Alloys and Compounds 408-412 (2006) 820-823.

R. Kasuya et al., "Photoluminescence Enhancement of PEG-Modified YAG:Ce3+ Nanocrystal Phosphor Prepared by Glycothermal Method," J. Phys. Chem. B 2005, 109, 22126-22130.

* cited by examiner

NANOSCALE PHOSPHOR PARTICLES WITH HIGH QUANTUM EFFICIENCY AND METHOD FOR SYNTHESIZING THE SAME

BACKGROUND OF THE INVENTION

1. Field of the Invention

The present invention generally relates to nanoscale phosphor particles having a high internal quantum efficiency (IQE) useful for light emitting diodes (LED) and other optical devices.

2. Description of the Related Art

The particle size of phosphor materials utilized in applications such as fluorescent lamps, cathode ray tubes (CRTs), plasma display panels (PDPs), and white LEDs is usually around 1 μm to 10 μm. Additionally, smaller sized phosphor powder, e.g., less than 1 μm, have been used in PDPs. Recently, nanoscale phosphor materials have attracted a lot of attention due, in part, to their improved resolution in display devices and lowered scattering loss in the phosphor layer. These phosphor materials are usually manufactured using solid state reaction processes, which include a mixing process of raw material powders, sintering process under high temperature and high pressure, and pulverization of the sintered ceramic compacts to make micron sized phosphor powder. This process is also known as a "break down method," which reflects upon the pulverization process that includes grinding of the particles into the smaller size.

However, using the aforementioned break down method tends to negatively affect the desired property of a high IQE of the phosphor particle materials. This is due, in part, to the generation of surface defects that occurs with the increased grinding of the particles to render them smaller. In addition to the surface defects caused by the grinding, there is no known practical method of physically grinding the phosphor powder down to a particle size of less than 200 nm using the break down methods.

Recently, nanoscale phosphor particle synthesis via "bottom up methods" has been used. For example, see U.S. Patent Application Publication No. 2006/0166057 to Kodas et al., U.S. Pat. No. 5,885,492 to Lee et al., U.S. Pat. No. 7,101,520 to Kumar, and U.S. Pat. No. 6,692,660 to Kumar, the contents of each reference is hereby incorporated by reference in its entirety. It is possible to synthesize nano-sized phosphor particles with relatively few surface defects when phosphor particles are built up from the atomic level in these so-called bottom up methods. However, surface atoms develop on the phosphor particles as the particle size decreases, resulting in an adverse drop in the IQE. For example, when the average particle size of the phosphor particles manufactured in the bottom up method become less than 200 nm, less than 100 nm, less than 50 nm, and less than 30 nm, the increased portion of surface atoms significantly lower the IQE. As reported in R. Kasuya et al., "Photoluminescence Enhancement of PEG-Modified YAG:Ce3+ Nanocrystal Phosphor Prepared by Glycothermal Method," J. Phys. Chem. B 2005, 109, 22126-22130 and R. Kasuya et al., "Glycothermal synthesis and photoluminescence of YAG:Ce3+ nanophosphors," Journal of Alloys and Compounds 408-412 (2006) 820-823 (the contents of both reference is hereby incorporated by reference in their entireties), surface passivation by organic compounds is critical, and they reported a phosphor particle IQE of 37.9% by properly surface treated nanoscale phosphor particle.

It is also reported that IQE tends to decrease about 1/7-1/8 of the initial IQE value when the organic compound for the surface passivation layer is removed by thermal decomposition at a temperature of around 1000 K. Therefore, it has been very difficult to obtain nanoscale phosphor particles with a reasonable IQE comparable to micron sized phosphor particle unless appropriate surface passivation is applied. The trade-off of manufacturing smaller particle sizes has come at a cost of lower IQE. Moreover, even after surface passivation, the reported highest value of IQE is still lower than 40%.

SUMMARY OF THE INVENTION

In view of the foregoing, in an embodiment of the present invention, provided herein is a method of producing phosphor nanoparticles with a narrow size distribution and very high internal quantum efficiency. The methods described herein provide nanoscale particles of phosphor material.

In an embodiment, there is provided a batch of nanoscale phosphor particles with an average particle size of less than about 200 nm. In an embodiment, the batch of nanoscale phosphor particles have an average internal quantum efficiency (IQE) of at least about 40%. In an embodiment, the batch of nanoscale phosphor particles are substantially free of impurities. The "internal quantum efficiency" (IQE), as described herein, is the ratio of the number of photons absorbed by the phosphor material to the number of photons emitted by the phosphor material. In an embodiment, the IQE of the phosphor particles is at least about 55%. In an embodiment, the IQE of the phosphor particles is at least about 65%.

Also described herein are methods of manufacturing nanoscale phosphor particles having an average particle size of less than 200 nm and having an average internal quantum efficiency of at least 40%. The methods of manufacturing can be used to make any of the phosphor particles described herein, including particles having various particle sizes and/or IQE values. In an embodiment, the method comprises the steps of (i) passing a carrier fluid comprising phosphor precursors through a reactive field, wherein the temperature of the reactive field is greater than about 3000 K, thereby dissociating the phosphor precursors into elements and (ii) nucleating the elements to thereby precipitate nanoscale phosphor particles.

The reactive field used to dissociate the phosphor precursors can be produced in various ways. Preferably, the reactive field provides high temperatures that are capable of dissociating the phosphor precursor into elements. In an embodiment, the reactive field is produced by radio frequency (RF) plasma. In an embodiment, the nucleating step comprises supplying a quenching gas toward the freshly nucleated phosphor particles.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein. Further aspects, features and advantages of this invention will become apparent from the detailed description of the preferred embodiments which follow. These and other features of this invention will now be described with reference to the drawings of preferred embodiments which are intended to illustrate vari-

DETAILED DESCRIPTION OF THE PREFERRED EMBODIMENT

Figure 1:
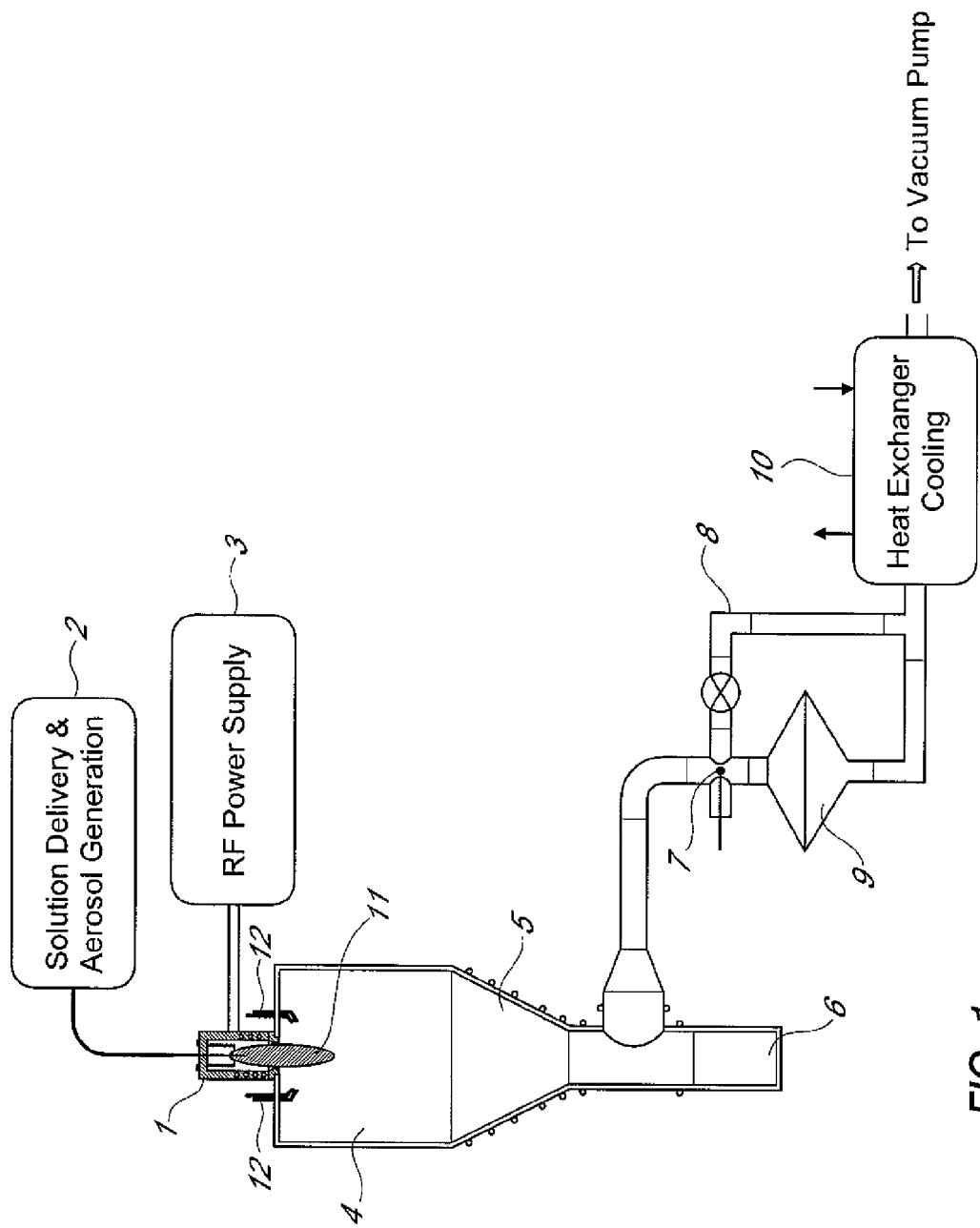
FIG. 1 is a schematic diagram of an RF induction plasma apparatus usable in an embodiment of the present invention.

The phosphor particles described herein provide a combination of advantageous properties that are normally inverse to one another. For example, the nanoscale phosphor particles described herein can be made with both a low average particle size and a high internal quantum efficiency. Furthermore, the particle sizes can have a narrow distribution range. Also, the nanoscale phosphor particles can be made with good environmental stability. The phosphor nanoparticles described herein are useful in many applications including, for example, white LED, display devices, illumination apparatus, as well as stable, non-toxic material for biomedical applications such as labeling. Described herein are a batch of nanoscale phosphor particles, wherein the particles have an average particle size of less than about 200 nm and an average internal quantum efficiency of at least about 40%.

The average particle size can be any of a variety of nanoscale sizes. In an embodiment, the average particle size of the phosphor particles is less than about 100 nm. In an embodiment, the average particle size of the phosphor particles is less than about 50 nm. In an embodiment, the average particle size of the phosphor particles is less than about 30 nm. In an embodiment, the average particle size of the phosphor particles is between about 3 nm and about 30 nm. In an embodiment, nanoscale phosphor particles have an average particle size between any two numbers of the foregoing, including from 3 nm to 200 nm.

The batch of phosphor particles manufactured in accordance with the methods described herein can have a narrow size distribution range. For example, at least 95 percent of the particles can have a particle size which is less than 5 times the average particle size. In an embodiment, at least 99 percent of the particles have a particle size which is less than 5 times the average particle size. In an embodiment, at least 99.5 percent of the particles have a particle size which is less than 5 times the average particle size. In an embodiment, at least 95 percent of the particles have a particle size which is less than 4 times the average particle size. In an embodiment, at least 99 percent of the particles have a particle size which is less than 4 times the average particle size. In an embodiment, at least 99.5 percent of the particles have a particle size which is less than 4 times the average particle size. In an embodiment, at least 95 percent of the particles have a particle size which is less than 6 times the average particle size. In an embodiment, at least 99 percent of the particles have a particle size which is less than 6 times the average particle size. In an embodiment, at least 99.5 percent of the particles have a particle size which is less than 6 times the average particle size.

The batch of nanoscale phosphor particles described herein can be substantially free of impurities. As used herein, the term "substantially free of impurities" refers to a lack of impurities sufficient to maintain the internal quantum efficiency at high levels in accordance with the understanding in the art. In an embodiment, the batch of nanoparticles is at least about 95% or greater free of impurities. In an embodiment, the batch of nanoscale phosphor particles is at least about 99% free of impurities. In an embodiment, the batch of nanoscale phosphor particles is at least about 99.5% free of impurities. In an embodiment, the batch of nanoscale phosphor particles is at least about 99.9% free of impurities. In an embodiment, the batch of nanoscale phosphor particles is at least about 99.99% free of impurities.

The batch of nanoscale particles described herein can have a high internal quantum efficiency. In an embodiment, the average internal quantum efficiency is at least about 45%. In an embodiment, the average internal quantum efficiency is at least about 50%. In an embodiment, the average internal quantum efficiency is at least about 55%. In an embodiment, the average internal quantum efficiency is at least about 60%. In an embodiment, the average internal quantum efficiency is at least about 65%. In an embodiment, the average internal quantum efficiency is at least about 70%. In an embodiment, the average internal quantum efficiency is at least about 75%. The high quantum efficiency is achievable even when the average particle size is less than 200 nm. In an embodiment, the IQE of the nanoscale phosphor particles is substantially the same as that of phosphor particles having a size on the order of 1 to 10 microns.

The shape of the nanoparticles can vary. For example, the nanoparticle shape can be regular or irregular. In an embodiment, the nanoscale phosphor particles are spherical. "Spherical," as used herein, does not require that the particle be a perfect sphere, but rather, the particle should be substantially spherical to impute the properties provided herein as will be understood by those having ordinary skill in the art. The spherical nature of the nanoparticles is due, in part, to the exposure of the phosphor precursor to a high temperature field which essentially dissociates the precursor into elements and the subsequent nucleation of the dissociated precursor into polymers. This method avoids commonly used particle synthesizing techniques, such as grinding, which tend to create irregularly shaped particles.

In an embodiment, the batch of nanoscale phosphor particles comprise a host crystal lattice. The host crystal lattice can comprise any suitable material. In an embodiment, the host crystal lattice is selected from the group consisting of metal oxide, metalloid oxide, metal nitrate, metal oxynitride, guest dopant of rare earth metals, and combinations thereof.

The methods of manufacturing nanoscale phosphor particles described herein can be used in the production of the particles. An embodiment provides a method of manufacturing nanoscale phosphor particles having an average particle size of less than about 200 nm and having an average internal quantum efficiency of at least about 40%. In an embodiment, the method comprises passing a carrier fluid comprising phosphor precursors through a reactive field to thereby dissociate the phosphor precursors into elements. After the phosphor precursors are dissociated, the elements can be nucleated to thereby precipitate nanoscale phosphor particles.

The carrier fluid can be delivered to the reactive field according to any number of suitable methods including, for example, by aerosol. In an embodiment, the carrier fluid is a liquid comprising phosphor precursor and a solvent. In an embodiment, the solvent is an aqueous solvent. In an embodiment, the carrier fluid comprises an aqueous solution in which the phosphor precursors are completely dissolved.

In an embodiment, the carrier fluid comprises the phosphor precursor material and is in the form of a solution or a suspension. The carrier fluid can comprise constituent elements intended for phosphor nanoparticle formation. Any suitable phosphor material can be used including, for example, oxide, nitride, oxynitride, and sulfide. Suitable phosphor precursors are described in JP-A Nos. 50-6410, 61-65226, 64-22987, 64-60671 and 1-168911, the contents of each of which are hereby incorporated by reference in their entirety.

In an embodiment, the carrier fluid comprises a combination of (1) one or more metal oxides, (2) one or more sulfides, and (3) one or more ions of rare earth metals or one or more ions of metals. Any suitable metal oxide or combination of metal oxides can be used. For example, the metal oxide can be represented by $Y_2O_2S$, $Zn_2SiO_4$, and/or $Ca_5(PO_4)_3Cl$. In an embodiment, the metal oxide comprises a crystal matrix. Some examples of metal oxides comprising a crystal matrix include, for example, ZnS, $Y_2O_2S$, $Y_3Al_5O_{12}$, $Y_2SiO_5$, $Zn_2SiO_4$, $Y_2O_3$, $BaMgAl_{10}O_{17}$, $BaAl_{12}O_{19}$, (Ba,Sr,Mg)O, $BaAl_2O_3$, $(Y,Gd)BO_3$, $Y_2O_3$, (Zn,Cd)S, $SrGa_2S_4$, SrS, GaS, $SnO_2$, $Ga_{10}(PO_4)_6(F,Cl)_2$, $(Ba,Sr)(Mg,Mn)Al_{10}O_{17}$, $(Sr,Ca,Ba,Mg)_{10}(PO_4)6Cl_2$, $(La,Ce)PO_4$, $CeMgAl_{11}O_{19}$, $GdMgB_5O_{10}$, $Sr_2P_2O_7$, $Sr_4Al_4O_{25}$, $Ca_x(Si,Al)12(O,N)_{16}$ (wherein x can be any suitable integer that forms a known metal oxide), and $CaSiAlN_3$. Where two elements appear together within a parentheses and are separated by a comma, selection can be made of either element.

Any suitable sulfide or combination of sulfides can also be used. For example, the sulfide can be represented by ZnS, SrS and/or CaS. The ions of rare earth metals or combinations of ions of rare earth metals can be selected from the group consisting of Ce, Pr, Nd, Pm, Sm, Eu, Gd, Tb, Dy, Ho, Er, Tm, Yb, and combinations thereof. Other ions that are suitable include metals such as Ag, Al, Mn, Sb, and combinations thereof as an activator or a co-activator.

The concentration of the precursor solution (e.g. carrier fluid) may be controlled if the precursors (usually solid powder) can be dissolved/suspended in solvent, though the degree of solubility may depend on the sort of precursor, solvent, and their combination utilized. In some embodiments, the concentration of precursor is about 0.01 M to about 2 M. In an embodiment, the concentration of precursor is about 0.1 M to about 1 M.

Any kind of solvent such as water, alcohol, and the other inorganic and organic solvents, or a combination thereof may be used, and not particularly limited. An appropriate solvent can be chosen based upon the selection of the precursor.

In an embodiment, the reactive field provides a high temperature environment that can dissociate the precursors. Selection of the reactive field can be made depending on the temperature required and the precursor material to be dissociated. Various physical processes can be used to dissociate the precursors in order to create nanoscale phosphor particles having high IQE. For example, methods such as the flame pyrolysis method, the spray pyrolysis method, the microwave induced combustion method, the DC plasma method, and the RF induction plasma method can be used. Additionally, various wet chemical processes can also be used including, for example, the co-precipitation method, the sol-gel method, the glycothermal method, and the solvothermal method.

In an embodiment, the reactive field comprises an RF plasma. RF induction plasma, which can provide extremely high temperatures, is a preferable process to use in the preparation of nanoscale phosphor particles because, in part, raw material can exit from the RF induction plasma in a uniform manner. The temperature of the RF plasma as a reaction zone can be about 10,000 K to about 12,000 K, and raw material precursors can be completely dissociated under such temperatures. Additionally, high IQE nanoscale phosphor having substantially high purity can be formed because the plasma is generated without any electrodes. By avoiding the use of electrodes, one can preclude the likelihood of electrode material penetrating the nanoparticles as contaminants.

The RF thermal plasma has nonuniform temperature distribution extending radially outward from the center. Plasma conditions are typically controlled by parameters such as plate power and grid current of the RF power supply. In an embodiment, the methods described in Eckert, H. U., "The induction arc: a state-of-the-art review," High Temperature Science, 6: 99-134 (1974); Boulous, M. I., "The inductively coupled R.F. (radio frequency) plasma," Pure and Applied Chemistry, 57(9): 1321-1352 (1985); and Matsumoto et al., "Synthesis of diamond films in a RF induction thermal plasma," Applied Physics Letters, 51: 737-739 (1987), the disclosures of each of which are incorporated herein by reference in their entirety, are utilized to create the RF plasma.

The temperature of the reactive field can vary. In an embodiment, the reactive field is at least about 3000 K. In an embodiment, the reactive field is at least about 4000 K. In an embodiment, the reactive field is at least about 5000 K. In an embodiment, the reactive field is at least about 6000 K. In an embodiment, the reactive field is at least about 7000 K. In an embodiment, the reactive field is at least about 8000 K. In an embodiment, the reactive field is at least about 9000 K. In an embodiment, the reactive field is at least about 10000 K. In an embodiment, the reactive field is at least about 11000 K. In an embodiment, the reactive field ranges from about 3000 K to about 12000 K.

The reactive field can comprise a directional flow. For example, an RF plasma torch may be used which provides a reactive field having a directional flow that flows from the torch where the plasma originates towards the direction in which the plasma travels away from the torch. The carrier fluid can be delivered to the reactive field such that it flows downstream with the directional flow of the plasma. Alternatively, the carrier fluid can be delivered to the reactive field such that it flows upstream against the directional flow of the plasma.

After the precursor materials have been dissociated into elements, the elements can then be nucleated into small nanoscale species that form particles. In an embodiment, the nucleating step comprises supplying a quenching gas toward the freshly nucleated phosphor particles. Any suitable quenching gas can be used. Preferably, the quenching gas is a stable, non-reactive gas. In an embodiment, the quenching gas comprises argon or nitrogen.

FIG. 1 represents a schematic diagram of an RF induction plasma apparatus usable in an embodiment of the present invention. A plasma torch 1 is supplied with power from a separate generator, which can be an RF power supply 3 for igniting and sustaining the plasma 11. A prepared carrier fluid comprising the phosphor precursor is delivered into the plasma region 11 by using a pump for solution delivery and an aerosol generation unit 2, which is inserted into the plasma torch. The RF plasma 11 stretches into main chamber 4 from the region of the plasma torch 1. Thus, the directional flow of the plasma in FIG. 1 is from the plasma torch to the main chamber 4. In the embodiment illustrated by FIG. 1, the length of the plasma is about 4 inches (±50%) and the diameter of the plasma is about 1 inch (±50%). However, the length and diameter of the plasma can be adjusted by one having ordinary skill in the art by varying operation conditions and/or reactor design.

A quenching gas, such as argon or nitrogen, can be supplied into the main chamber 4 near the region of the plasma torch 1 by quenching gas inlet 12. The flow rate of the quenching gas can vary and depend on, for example, the size of the plasma or the volume of chamber. In an embodiment, the flow rate of the quenching gas is from about 10 slm to about 1,000 slm (wherein slm=standard liters per minute). The phosphor precursor dissociates traveling through the plasma 11 into elements, which then begin to nucleate in the main chamber 4 to form the nanoscale phosphor particles. The particles are carried by gas flow towards a vacuum pump. The main chamber 4 and reducing cone 5 are continuously cooled by cooling water. Large particles, which are not nanoscale, are not carried by the gas flow towards the vacuum pump because of their high inertia. Instead, larger particles directly fall down into large particle collector 6 are thus separated from nanoscale powders.

Nanoscale phosphor particles travel towards a thermocouple 7 and are collected in a nanoparticle collector 9. The gas continues towards the vacuum pump via a bypass line 8, and travels through a heat exchanging cooling unit 10 because of the high gas temperatures around the synthesis chamber before the gas reaches the vacuum pump. If necessary, additional cyclone or cascade impactor type separators can be incorporated into the process in order to assure large particle separation.

Figure 2:
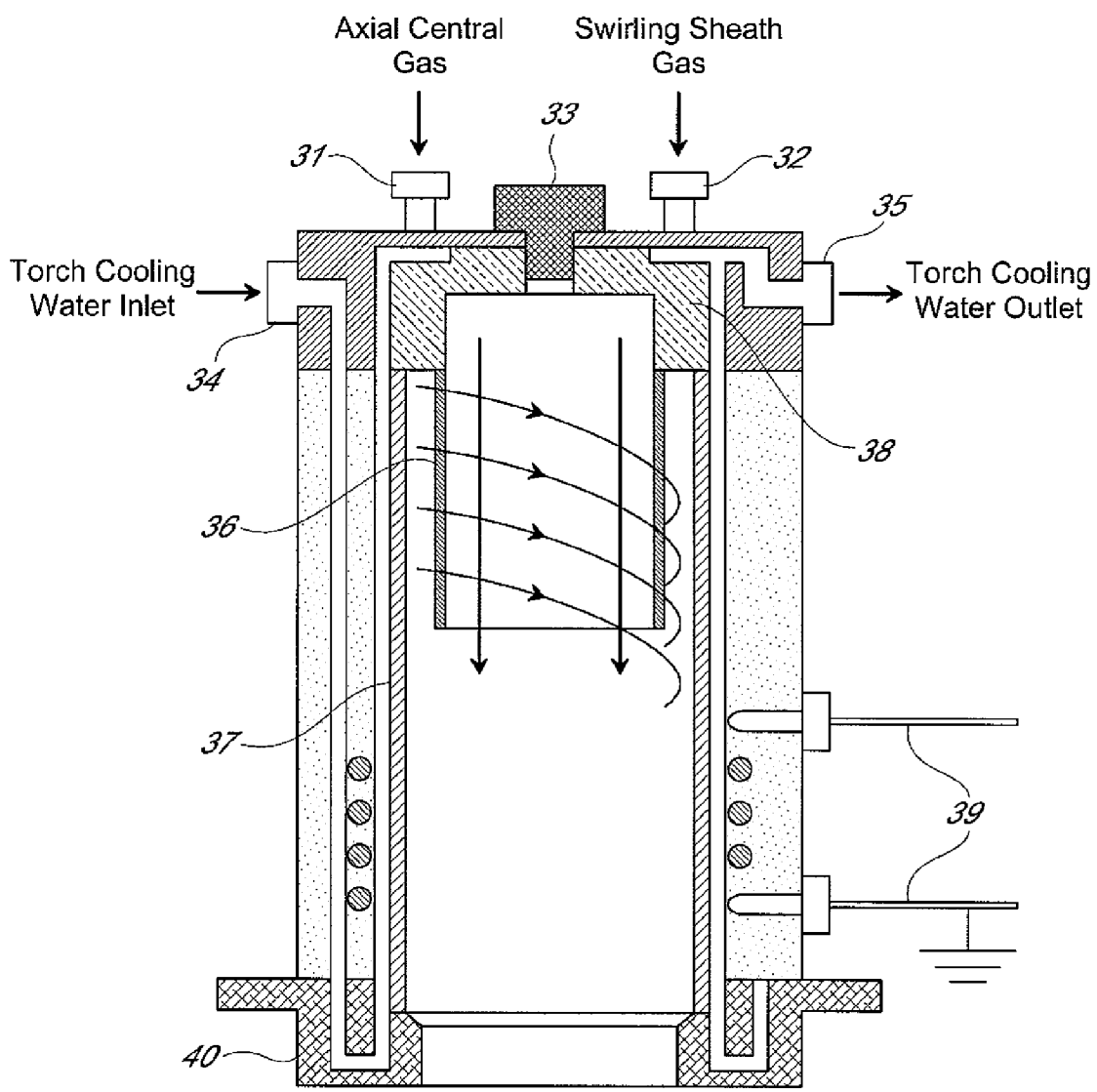
FIG. 2 is a schematic diagram of an RF plasma torch usable in an embodiment of the present invention.

FIG. 2 shows an enlarged schematic of an embodiment of an RF plasma torch 1 shown in FIG. 1. An injection probe 33 is attached to the end of solution delivery unit (e.g. the aerosol generation unit illustrated as 2 in FIG. 1). A carrier fluid comprising phosphor precursor solution is atomized by the injection probe 33 and small droplets are generated (aerosol) for delivery into the plasma region. An example of an injection probe useful in the apparatus is a two fluid nozzle type. Any suitable atomization gas can be used including, for example, argon, nitrogen, oxygen, air or any combination thereof.

In an embodiment, the average size of the droplets produced in the aerosol is about 50 μm (±50%). However, the size can be changed by one having ordinary skill in the art by adjusting the atomization probe, solution viscosity, flow rate of the atomization gas, and delivery rate of the solution, for example. In an embodiment, the size of the droplets is from about 0.1 μm to about 200 μm. The droplet size should be small enough such that the it completely evaporates when contacted with the plasma. The droplets, including raw materials and solvents, should be dissociated into atomic form due to the extremely high temperature of the plasma. Therefore, when the size of the droplets are reasonably small, the droplet size does not sensitively affect the resultant particle size. However, if the droplets are too big, the resultant particle size distribution can be wide due to the incomplete evaporation of solvent from the droplet and subsequent non-homogeneity of the precursor dissociation reaction.

In addition to the high temperatures provided by the plasma, a very high energy density can also be provided by the plasma such that any kind of precursor can be dissociated into atomic form. Therefore, precursors that are in gaseous, liquid, or solid powder form can be completely dissociated in the RF plasma. In an embodiment, the carrier fluid comprising the phosphor precursors is selected from the group consisting of a gas, liquid, solid powder, slurry (powders dispersed into liquid), and combinations thereof. However, powders with large particle sizes should generally be avoided, because large particles in the precursor could result in insufficient dissociation. In an embodiment, the carrier fluid comprising the phosphor precursor is selected from the precursors described in U.S. Patent Application Publication Nos. 2007/0029291 and 2006/0226564, the contents of which are hereby incorporated by reference in their entirety, The plasma torch in FIG. 2 is kept cool by circulating cooling water from torch cooling water inlet 34 to torch cooling water outlet 35. The cooling water prevents the constituent metal of the plasma torch from melting down. RF power is supplied to the torch via induction coil 39. Axial central gas is supplied by gas inlet 31 and swirling sheath gas are supplied by gas inlet 32. The generated plasma is kept confined within a ceramic plasma confinement tube 37. The droplets of precursor solution are delivered and exposed to plasma via alumina intermediate tube 36. Although gas flow is adjusted by a gas distributor 38, the droplets of precursor solution are effectively delivered into plasma region by the swirling sheath gas from gas inlet 32. The raw materials dissociated by plasma are fed into a main chamber (numeral 4 in FIG. 1) via a torch exit nozzle 40.

The particle size of the nanoscale phosphor particles can be controlled by adjusting several factors including, for example, the plasma temperature, RF frequency power, atomization speed, initial droplet size of the aerosol, chamber gas pressure and rate of gas flows. In an embodiment, the plasma temperature ranges from about 3,000 K to about 12,000 K to provide the temperature of the reactive field. The atomization speed of the carrier fluid comprising the phosphor precursor (e.g. precursor solution) can vary. In an embodiment, the atomization speed of precursor solution ranges from about 0.1 ml/min to about 100 ml/min. In an embodiment, the residence time of the raw materials within plasma region is from about 5 ms to about 50 ms. In an embodiment, the residence time of the raw materials within plasma region is from about 10 ms to about 20 ms.

In an embodiment, the power applied from the RF power supply to the plasma torch is from about 10 kW to about 500 kW. In an embodiment, 3.3 MHz is the frequency of RF power. In an embodiment, the gas pressure inside the main chamber pressure is from about 5 kPa to about 100 kPa.

As the atomized phosphor precursor solution/suspension is introduced into the plasma, different portions of the precursor evaporate over time. For example, first, the solvents evaporate from the precursor, which thereby concentrates the droplet in terms of the dissolved/suspended phosphor precursor materials. The raw phosphor precursor materials are then dissociated into their atomic constituents utilizing the extremely high enthalpy of the plasma. As the dissociated precursor travels through the plasma and exits from the plasma region, the surrounding temperature begins to decrease. Then, the effluent gases become supersaturated with the vapors of the dissociated precursor constituents. This leads to homogeneous and/or heterogeneous nucleation of particles which grow further by either vapor-phase growth or coalescence. The flow of dissociated material can be quenched rapidly at the exit of the plasma torch in order to reduce the possibility of coalescence and agglomeration. The generated particles are thus formed in the nanoscale size. This principle is further discussed in U.S. Pat. Nos. 5,609,921 and 6,994,837, the contents of both of which are hereby incorporated by reference in their entirety.

The resulting nanoscale phosphor particles can be amorphous, poly crystal, single crystal, or a mixture thereof, depending on the kinds of materials synthesized and their production conditions, as will be understood by those skilled in the art. However, a separate post-heat treatment can be performed if a different crystalline phase or increased crystallinity are required. The post-heat treatment condition can be determined by using thermal analysis like a DTA (differential thermal analysis) and the crystalline phase can be confirmed by XRD (X-ray diffraction).

For example, Ce-doped yttrium aluminum garnet (YAG: Ce) that was synthesized in accordance with the methods described herein showed a phase transition around 1390 K by DTA when the heating rate was 20 K/min. In a DTA measurement, the phase transition temperature depended upon the heating rate for measurement. Usually, slower heating rates makes the peak temperature of the phase transition lower. Therefore, the post-heat treatment temperature can be determined by taking treatment time and heating rate into account.

Typically, the post-heat treatment temperature is higher than the phase transition temperature. However, the post-heat treatment temperature should not be too much higher than the phase transition temperature because nanoscale particles tend to get fused and aggregated together if the temperature is too high. Therefore, for YAG as an example, the post-heat treatment temperature can range from about 1150 K to about 1500K. As for treatment time, generally, the lower temperature requires longer treating duration and the higher temperature requires a shortened treating duration. In an embodiment, the post-heat treatment time ranges from about 10 minutes to about 10 days. The atmospheric conditions for the post-heat treatment can be selected according to the materials treated. Suitable atmospheric conditions include air, nitrogen, oxygen, vacuum, inert gases such as argon, helium, neon, krypton, xenon, reducing gases such as hydrogen, and combinations thereof Typically, atmospheric pressure is used, but both positive and negative pressure also can be provided according to the materials treated.

The phosphor nanoparticles described herein can be incorporated into a polymeric resin as a composite, which is a practical embodiment for devices, where such devices include, but are not limited to, optical devices such as LEDs, display devices, illumination apparatuses, as well as stable, non-toxic materials for biomedical applications such as labeling. Any suitable polymeric resin can be used. In the present disclosure where conditions and/or structures are not specified, the skilled artisan in the art can readily provide such conditions and/or structures, in view of the present disclosure, as a matter of routine experimentation.

Evaluation Method for Internal Quantum Efficiency (IQE)

A luminescent efficiency of phosphor material can be evaluated by measuring the photoluminescent emitted from the phosphor powders under the irradiation of excitation light with predetermined intensity. However, net excitation light, which practically penetrates into the inside of the phosphor powder, can be changed by the degree of reflection on the surface of the phosphor powders. In addition, the reflection is not a simple reflection, but rather, a complicated multiple reflection also known as a diffuse reflection. With nanoscale particles, it is unsuitable to acquire the performance factor of phosphor with reasonable accuracy by the aforementioned method, since the diffuse reflectance generally varies depending on the particle sizes. For the most part, it is important that the ratio of how many photons from excitation light are penetrated into the inside of the phosphor and how many photons are generated from the phosphor.

The IQE of phosphor material can be expressed by the following formula:

$$\text{Internal Quantum Efficiency} = \frac{\int \lambda \cdot P(\lambda) d\lambda}{\int \lambda \cdot [E(\lambda) - R(\lambda)] d\lambda}$$

where $E(\lambda)/h\nu$ is the number of photons in the excitation spectrum that are incident on the phosphor, $R(\lambda)h\nu$ is the number of photons in the spectrum of the reflected excitation light, and $P(\lambda)/h\nu$ is the number of photons in the spectrum of emission of the phosphor. This method of IQE measurement is also provided in Ohkubo et al., "Absolute Fluorescent Quantum Efficiency of NBS Phosphor Standard Samples," 87-93, J. Illum. Engng. Inst. Jpn. Vol. 83, No. 2, 1999, the disclosure of which is incorporated herein by reference in its entirety.

EXAMPLE 1

Preparation of Precursor Solution and Delivery to The Plasma Chamber 0.1485 mol (14.22 g) of yttrium (III) nitrate hexahydrate (99.9% pure, Sigma-Aldrich), 0.25 mol (23.45 g) of aluminum nitrate nonahydrate (99.97 pure, Sigma-Aldrich), and 0.03 mol (0.163 g) of cerium (III) nitrate hexahydrate (99.99 pure, Sigma-Aldrich) were dissolved together in 250 ml of deionized water. The mixture was ultrasonicated for 30 minutes to prepare a transparent solution. The precursor solution was a 0.4 M solution and was carried into a plasma reaction chamber similar to that shown in FIG. 1 via an atomization probe and a liquid pump.

Deposition Condition

All of the deposition experiments were conducted with an RF induction plasma torch (TEKNA Plasma System, Inc PL-35) operating at 3.3 MHz mounted in the center of an upper flange of the chamber 4 as shown in FIG. 1. For the deposition experiments, the chamber pressure was kept around 25 kPa to 35 kPa, and the RF generator plate power was in the range of about 10 to about 12 kW. Both the plate power and the deposition pressure are user-controlled parameters. Argon was introduced into the plasma torch 1 and both the swirling sheath gas and the central plasma gas were introduced via the gas inlet ports 31 and 32, respectively. Sheath gas flow was maintained at 30 slm (standard liters per minute), while central gas flow was 10 slm.

Precursor solution injection was performed using a radial atomization probe (TEKNA Plasma System, Inc SDR-772). The probe was positioned at the center of the plasma plume during reactant injection. The reactants were fed into the plasma plume at a rate of 10 ml/min during deposition. Atomization of the liquid reactant was performed with argon as atomizing gas delivered at a flow rate of 15 slm. Cooling water was supplied to the atomization probe and maintained at a flow rate of about 4 slm and at about 1.2 MPa pressure, as recommended by the manufacturer.

Crystalline phases of the deposited particles were investigated using X-ray diffraction (XRD) spectra obtained with a Bruker AXS micro-diffractometer (CuKα). The crystalline phase of the obtained sample identified the particles as a mixture of amorphous particles and yttrium aluminum perovskite (YAP). Scanning electron microscopy (SEM) was performed with a JEOL 6500 field emission gun microscope equipped with an energy dispersive spectrometer. The SEM images showed a bimodal size distribution with a majority of small nanoscale particles with less than 200 nm diameter and a. very small fraction of larger particles larger than 200 nm.

Transmission electron microscopy (TEM) was performed with a field emission gun transmission electron microscope, FEI Tecnai G2F30. The TEM images showed that particle sizes of a majority of small particles ranged from 5 nm to 200 nm with a spherical shape. The average particle diameter was obtained from BET surface area based on data acquired from a Micrometritics model ASAP 2000 gas sorptometer. The average particle diameter of the sample was 75 nm.

Post-heat Treatment to Covert YAP to YAG (Yttrium Aluminum Garnet)

In order to obtain a YAG phase, post-heat treatment was conducted at 1173 K, 1273 K, and 1473 K in $H_2/N_2=3\%/97\%$ for 2 hours using a quartz tube furnace (MTI Corporation OFT-1200X) at one atm. The rate of temperature increase was 10 K/min. After heat treatment, a yellowish colored powder was obtained for each sample.

XRD analysis was performed again, and it confirmed that all of the samples treated at each of the different temperatures showed the YAG crystalline phase. TEM images showed that the YAG phosphor particles treated at 1173 K were nearly aggregation free, while some aggregation was seen in the other samples treated at 1273 K and 1473 K. The average particle size of the particles was again measured by BET and were determined to be 107.3 nm (at 1473 K), 92.4 nm (at 1273 K), and 78.9 nm (at 1173 K).

Internal Quantum Efficiency (IQE)

IQE measurement was performed with Otsuka Electronics MCPD 7000 multi channel photo detector system together with required optical components such as integrating spheres, light sources, monochromator, optical fibers, and sample holder. Obtained phosphor powder was tabletized to a square shape of 15 mm² with about 1 mm thickness. The tabletized YAG sample was irradiated with a Xe lamp (150 W, L2274) at 460 nm after passing through a monochromator. An emission spectrum was acquired by using an integrating sphere.

Next, instead of the YAG tabletized sample, a diffuse reflectance standard (Labsphere, Spectalon®) with 50% of reflectance was placed under the integrating sphere. Continuous spectrum light from a halogen lamp source (150 W, MC2563) was used for irradiation, followed by acquisition of the reflectance spectrum as a reference for the reflectance spectrum measurement. The tabletized YAG sample was placed again and the reflectance spectrum of the sample was recorded. Finally, spectrum of excitation light was acquired by using the diffuse reflectance standard.

IQE was calculated from the data obtained based on the IQE equation set forth above. The IQE of the samples was determined to be 71.05% (at 1473 K), 67.21% (at 1273 K), and 63.82% (at 1173 K). As comparative data, commercial YAG phosphor powder (Kaser Optonix, Ltd P46-Y3) having a particle size around 1 micron to 10 micron prepared by solid state reaction was evaluated using the same procedures. The IQE of the micro scale phosphor powder measured at 73.51%, which was nearly the same as those of the nanoscale phosphors synthesized by the RF induction plasma system in the above embodiments.

EXAMPLE 2

Figure 3:
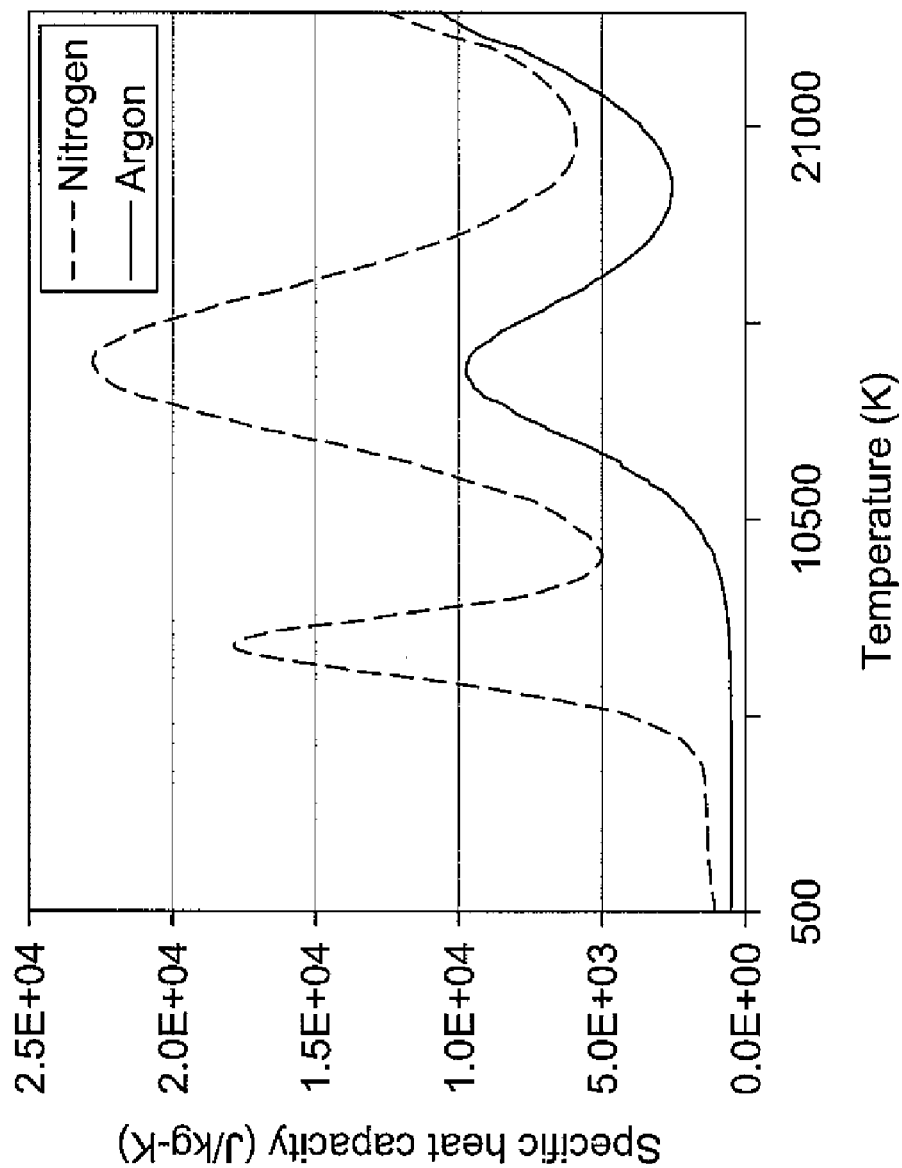
FIG. 3 is a graph showing the relationship between specific heat capacity and temperature of nitrogen and argon.

In this example, the quenching gas inlet ports 12 shown in FIG. 1 were moved such that the ports 12 were closer to the plasma region 11. The procedures were performed in the same way as in Example 1 except that nitrogen was used as the quenching gas in place of argon, thereby producing nanoscale phosphor samples. Nitrogen was used to improve control over particle size due to the higher specific heat capacity of nitrogen compared to that of argon. FIG. 3 shows that the specific heat capacity of nitrogen measured at elevated temperatures (e.g. about 1,000 to about 10,000 K) is substantially higher than that of argon, resulting in improved quenching of the nucleated particles.

Figure 4A:
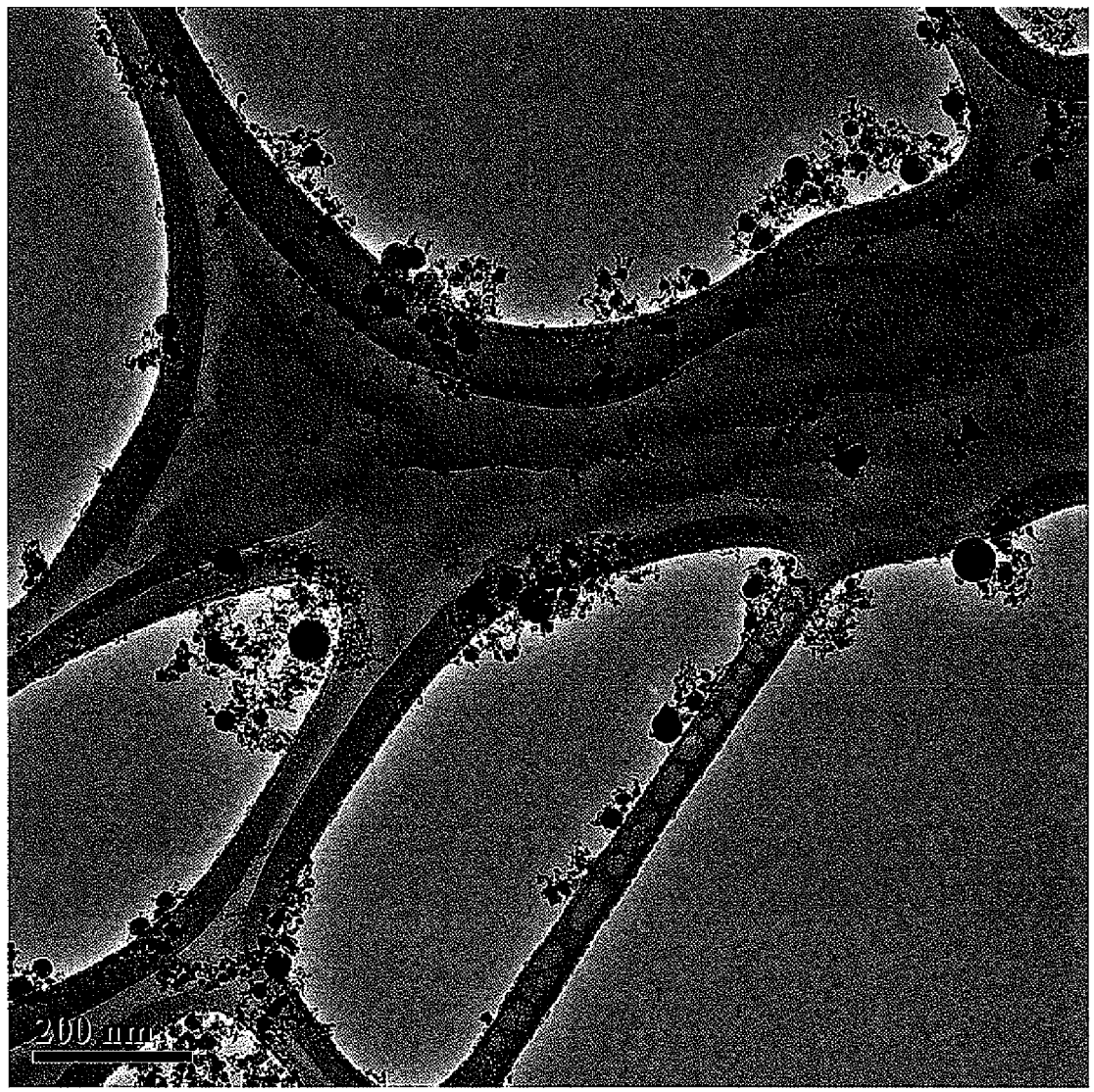
FIGS. 4(a) and 4(b) are TEM photographs showing nanoscale phosphor particles obtained in an embodiment of the present invention.
Figure 4B:
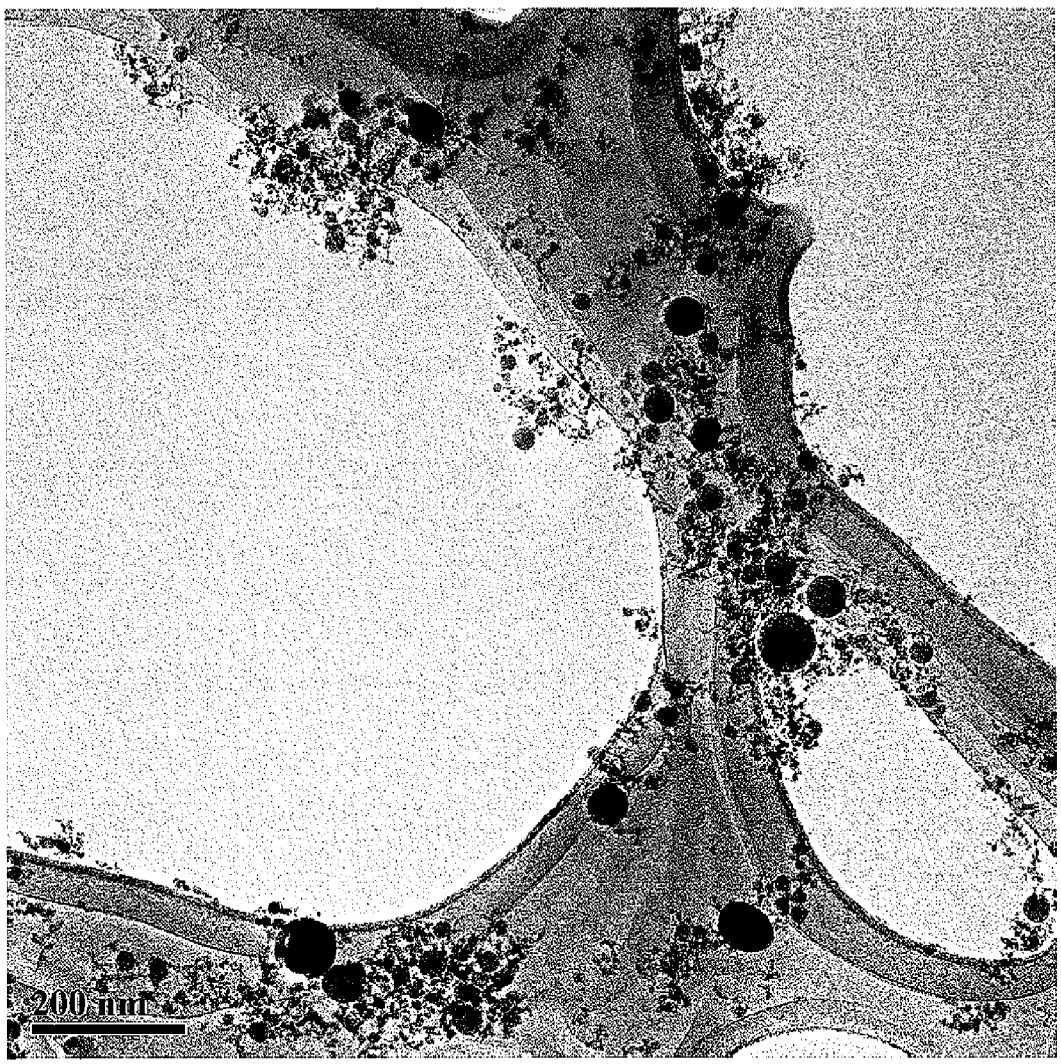

The nanoscale phosphor particles that resulted from this Example were also a mixture of amorphous particles and crystalline YAP, similar to Example 1. SEM images showed a bimodal size distribution with a majority of small nanoscale particles that were smaller than those obtained in Example 1. Some representative TEM images are shown in FIGS. 4(a) and 4(b). The TEM images showed that particle sizes of a majority of small particles ranged from 5 nm to 100 nm. BET measurements of the average particle size also confirmed the presence of smaller particles. The average particle size measured at 48.3 nm.

The same post-heat treatment steps described in Example 1 were performed to the particles of Example 2. The average particle size after post-heat treatment were determined by BET measurement as 88.6 nm (at 1473 K), 62.9 nm (at 1273 K), and 54.2 nm (at 1173 K). IQE was also measured, and was determined to be 69.87% (at 1473 K), 64.22% (at 1273 K), and 60.49% (at 1173 K).

Thus, in comparison with the samples from Example 1 having a slightly larger average particle size, the IQE of the samples from Example 2 did not significantly deteriorate even though the average particle size went from 75.0 nm to 48.3 nm. Although the average particle size of post-heat treated samples acquired by BET measurement were larger than 50 nm, a bunch of smaller particles than 50 nm were seen in both FIGS. 4(a) and 4(b). Therefore, the high IQE values in this invention are not only derived with relatively large nanoparticles, but also with smaller nanoparticles.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of manufacturing nanoscale phosphor particles having an average particle size of less than about 200 nm and having an internal quantum efficiency of at least about 40%, the method comprising:
   passing a carrier fluid comprising phosphor precursors through a reactive field in a main chamber, thereby dissociating the phosphor precursors into elements;
   wherein the gas pressure inside the main chamber is in the range of about 5 kPa to about 100 kPa;
   wherein the power applied to the reactive field is in the range of about 10 kW to about 500 kW;
   wherein the temperature of the reactive field is greater than about 3000 K; and
   nucleating the elements to thereby precipitate nanoscale phosphor particles, wherein the nucleating step comprises supplying a quenching gas toward the freshly nucleated phosphor particles.

2. The method according to claim 1, wherein the reactive field comprises an RF plasma.

3. The method according to claim 1, wherein the quenching gas comprises argon or nitrogen.

4. The method according to claim 1, wherein the reactive field comprises a directional flow.

5. The method according to claim 4, wherein the carrier fluid is delivered to the reactive field downstream with the directional flow.

6. The method according to claim 4, wherein the carrier fluid is delivered to the reactive field upstream against the directional flow.

7. The method to claim 1, wherein the carrier fluid is an aqueous solution in which the phosphor precursors are completely dissolved.

8. The method according to claim 1, wherein the average particle size is less than about 100 nm.

9. The method according to claim 1, wherein the average particle size is between about 3 nm and about 30 nm.

10. The method according to claim 1, wherein at least 99 percent of the nanoscale phosphor e particles have a particle size which is less than 5 times the average particle size.

11. The method according to claim 1, wherein the nanoscale phosphor particles are substantially free of impurities.

12. The method according to claim 1, wherein the internal quantum efficiency is at least about 55%.

13. The method according to claim 1, wherein the internal quantum efficiency is at least about 65%.

14. The method according to claim 1, wherein the nanoscale phosphor particles are spherical.

15. The method according to claim 1, wherein the nanoscale phosphor particles further comprise a host crystal lattice selected from the group consisting of metal oxide, metalloid oxide, metal nitride, metal oxynitride, guest dopant of rare earth metals, and combinations thereof.

16. The method according to claim 1, wherein the nanoscale phosphor particles comprise garnet.

17. The method according to claim 16, wherein the nanoscale phosphor particles comprise yttrium aluminum garnet.

18. The method according to claim 1, wherein the nanoscale phosphor particles further comprise one or more ions of rare earth metals.

19. The method according to claim 1, wherein the nanoscale phosphor particles further comprise one or more ions of Ce.

* * * * *